US012590658B1

(12) United States Patent
Wu

(10) Patent No.: US 12,590,658 B1
(45) Date of Patent: Mar. 31, 2026

(54) COUPLING ASSEMBLY AND COUPLING AUXILIARY ASSEMBLY

(71) Applicants: INVENTEC (PUDONG) TECHNOLOGY CORPORATION, Shanghai (CN); INVENTEC CORPORATION, Taipei City (TW)

(72) Inventor: Jun-Long Wu, Taipei City (TW)

(73) Assignees: INVENTEC (PUDONG) TECHNOLOGY CORPORATION, Shanghai (CN); INVENTEC CORPORATION, Taipei City (TW)

( * ) Notice: Subject to any disclaimer, the term of this patent is extended or adjusted under 35 U.S.C. 154(b) by 0 days.

(21) Appl. No.: 19/190,896

(22) Filed: Apr. 28, 2025

(30) Foreign Application Priority Data

Nov. 20, 2024 (CN) .......................... 202411669575.2

(51) Int. Cl.
| | |
|---|---|
| *F16L 37/00* | (2006.01) |
| *F16L 23/024* | (2006.01) |
| *F16L 23/18* | (2006.01) |
| *F16L 37/14* | (2006.01) |
| *H05K 7/20* | (2006.01) |

(52) U.S. Cl.
CPC ............. *F16L 23/024* (2013.01); *F16L 23/18* (2013.01); *F16L 37/14* (2013.01); *H05K 7/20272* (2013.01)

(58) Field of Classification Search
CPC . F16L 37/08; F16L 37/12; F16L 37/00; F16L 23/02; F16L 23/024; F16L 23/032; F16L 23/18; H05K 7/20272; H05K 7/20781
See application file for complete search history.

(56) References Cited

U.S. PATENT DOCUMENTS

| | | | | |
|---|---|---|---|---|
| 11,473,486 B2 * | 10/2022 | Huang | ................. | F16L 27/1017 |
| 11,692,643 B1 * | 7/2023 | Chen | ....................... | F16K 35/14 |
| | | | | 137/383 |
| 12,241,698 B2 * | 3/2025 | Lin | ..................... | F16L 27/0804 |
| 12,338,926 B1 * | 6/2025 | Lin | ........................ | F16L 27/026 |
| 2021/0348706 A1 * | 11/2021 | Yang | .................. | H05K 7/20272 |
| 2021/0381421 A1 * | 12/2021 | Huang | ................ | F16L 27/1017 |
| 2022/0136628 A1 * | 5/2022 | Li | ........................ | F16L 19/0212 |
| | | | | 285/19 |
| 2025/0203810 A1 * | 6/2025 | Tseng | ................. | H05K 7/20272 |

* cited by examiner

*Primary Examiner* — Aaron M Dunwoody
(74) *Attorney, Agent, or Firm* — Maschoff Brennan

(57) ABSTRACT
A coupling assembly includes a first coupler, a second coupler connected to the first coupler, a first base, at least one pin, at least one elastic member sleeved on the pin, a resilient ring sleeved on the second coupler and between the second coupler and the protrusion, and a second base. A hole of the first base is radially separated from the first through hole. The resilient ring includes at least one convex portion and at least one concave portion arranged alternately. The second base includes a body and at least one protrusion protruding from a side of the body close to the first base. The body is movably disposed on the first base along the axial direction through the pin and the elastic member. The second coupler passes through the body. The convex portion abuts against the protrusion.

9 Claims, 4 Drawing Sheets

10

COUPLING ASSEMBLY AND COUPLING AUXILIARY ASSEMBLY

CROSS-REFERENCE TO RELATED APPLICATIONS

This application claims priority under 35 U.S.C. § 119 (a) on Patent Application No(s). 202411669575.2 filed in China on Nov. 20, 2024, the entire contents of which are hereby incorporated by reference.

BACKGROUND

1. Technical Field

The present disclosure is related to a coupling assembly and a coupling auxiliary assembly, more particularly to a coupling assembly and a coupling auxiliary assembly including one or more elastic members.

2. Related Art

For servers using any cooling solution, a cooling pipeline is provided in a rack or cabinet where the servers are installed, and the cooling pipeline is connected to a liquid cooling module outside the rack/cabinet through a fluid coupler. Generally, in order to reduce assembly tolerance and improve assembly convenience, a floating coupling structure may be provided. The floating structure usually includes a fixed part and a movable part. The fixed part is fixed to the rack/cabinet and includes a through hole for the coupler to pass therethrough. The coupler is movably mounted on the fixed part through the movable part.

However, the movable member is conventionally located in the through hole. Therefore, the moving part occupies a floating space for the coupler. Moreover, in the case where the movable part occupies the floating space, the floating space for the coupler will become smaller and result in a problem of poor floating effect. If the size of the through hole is increased to ensure the floating effect, there will be a problem of larger volume of the entire fixed part. That is to say, it is difficult for the conventional floating structure to ensure floating effect of the coupler while considering a small volume of the fixed part.

SUMMARY

According to one embodiment of the present disclosure, a coupling assembly includes a first coupler, a second coupler, a first assembling base, at least one assembling pin, at least one clastic member, a resilient ring and a second assembling base. The second coupler is connected to the first coupler. The first assembling base includes a first coupler through hole and at least one assembling hole. The at least one assembling hole is radially separated from the first coupler through hole. The first coupler passes through the first coupler through hole along an axial direction. The at least one assembling pin is at least partially disposed in the assembling hole. The at least one elastic member is sleeved on the at least one assembling pin. The resilient ring includes at least one convex portion and at least one concave portion. The at least one convex portion and the at least one concave portion are arranged alternately. The resilient ring is sleeved on the second coupler. The second assembling base includes a body and at least one assembling protrusion. The at least one assembling protrusion protrudes from a side of the body close to the first assembling base. The body is movably disposed on the first assembling base along the axial direction through the at least one assembling pin and the at least one elastic member. The second coupler passes through the body. The resilient ring is between the second coupler and the at least one assembling protrusion, and the at least one convex portion of the resilient ring abuts against an inner side of the assembling protrusion.

According to another embodiment of the present disclosure, a coupling auxiliary assembly is configured to assemble a first coupler with a second coupler. The coupling auxiliary assembly includes a first assembling base, at least one assembling pin, at least one elastic member, a resilient ring and a second assembling base. The first assembling base includes a first coupler through hole and at least one assembling hole. The at least one assembling hole is radially separated from the first coupler through hole. The first coupler through hole is configured for the first coupler to pass therethrough along an axial direction. The at least one assembling pin is at least partially disposed in the assembling hole. The at least one elastic member is sleeved on the at least one assembling pin. The resilient ring includes at least one convex portion and at least one concave portion. The at least one convex portion and the at least one concave portion are arranged alternately. The resilient ring is sleeved on the second coupler. The second assembling base includes a body and at least one assembling protrusion. The at least one assembling protrusion protrudes from a side of the body close to the first assembling base. The body is movably disposed on the first assembling base along the axial direction through the at least one assembling pin and the at least one elastic member. The body is configured for the second coupler to pass therethrough. The resilient ring is between the second coupler and the at least one assembling protrusion, and the at least one convex portion of the resilient ring abuts against an inner side of the assembling protrusion.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

Figure 1:
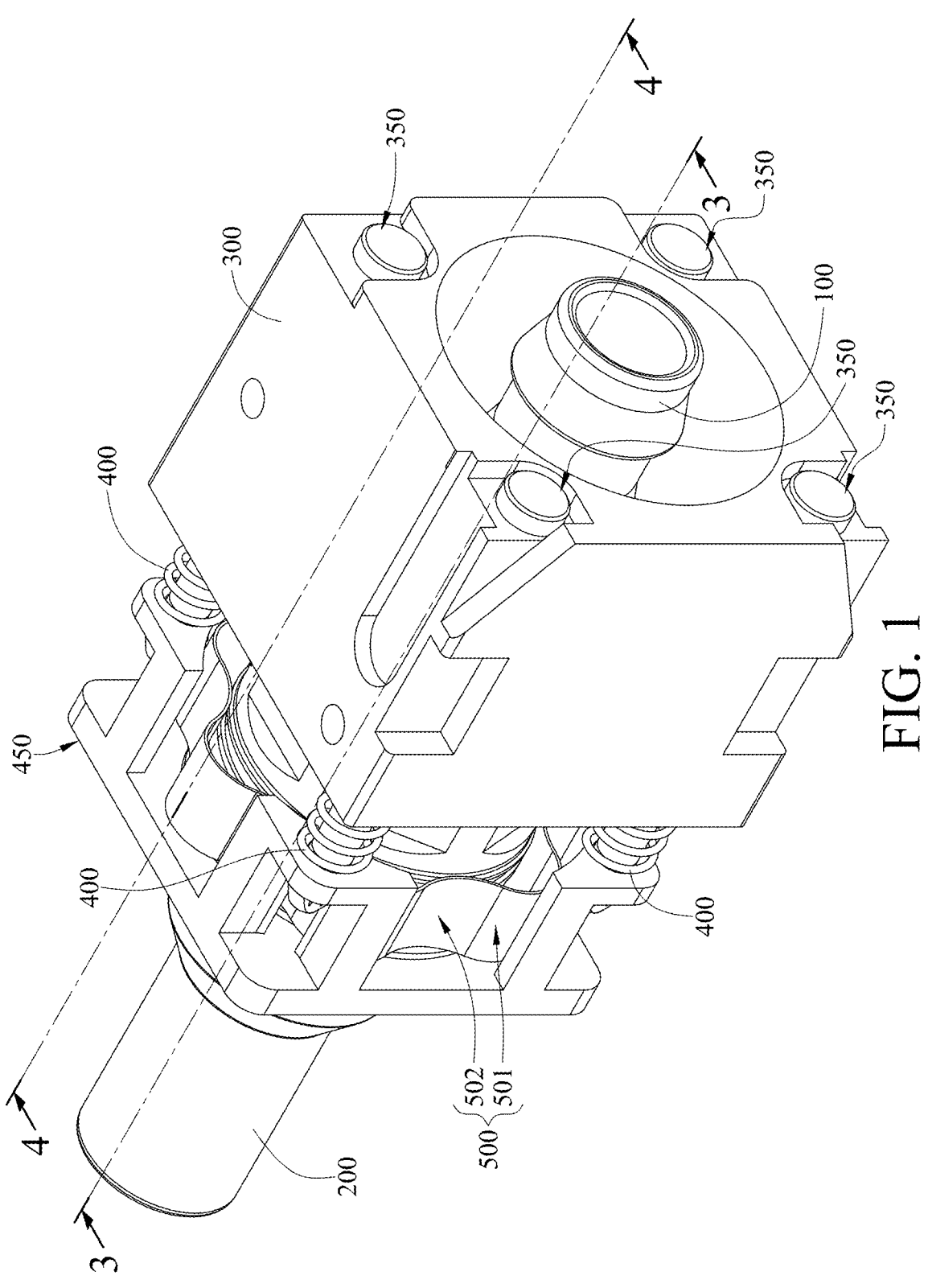
FIG. 1 is a perspective view of a coupling assembly according to one embodiment of the disclosure.
Figure 2:
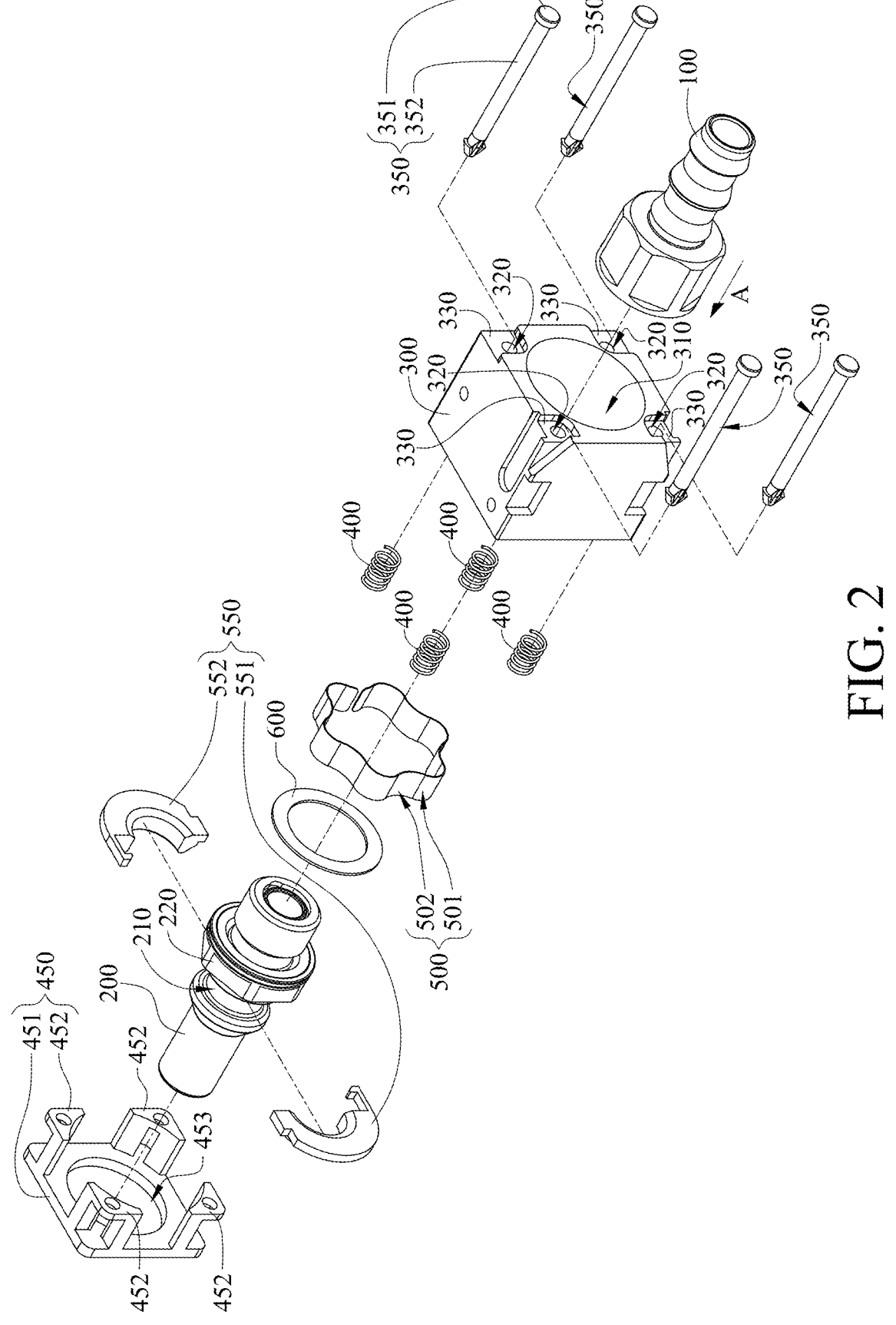
FIG. 2 is an exploded view of the coupling assembly in FIG. 1.
Figure 3:
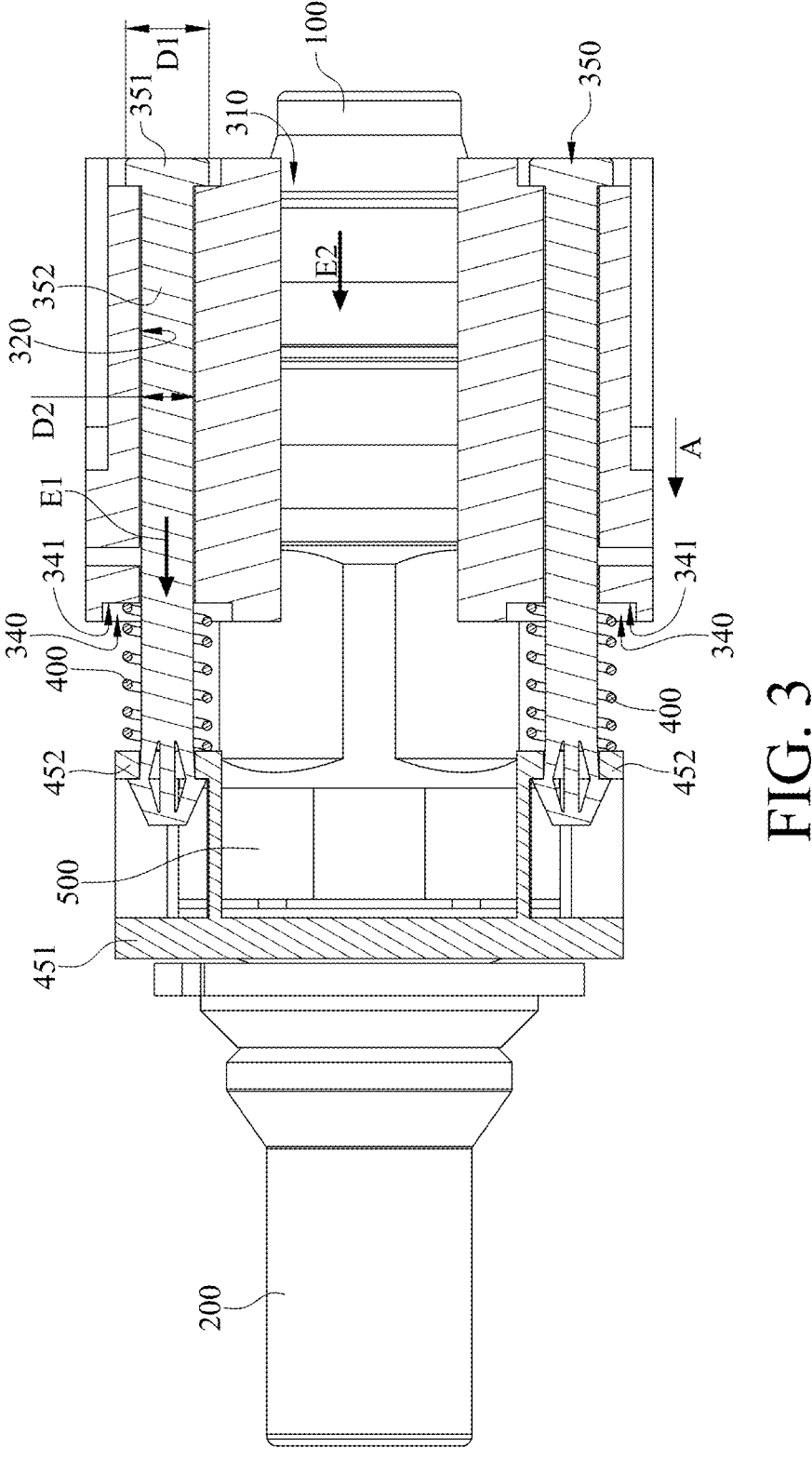
FIG. 3 is cross-sectional view of the coupling assembly along cutting line 3-3 in FIG. 1.
Figure 4:
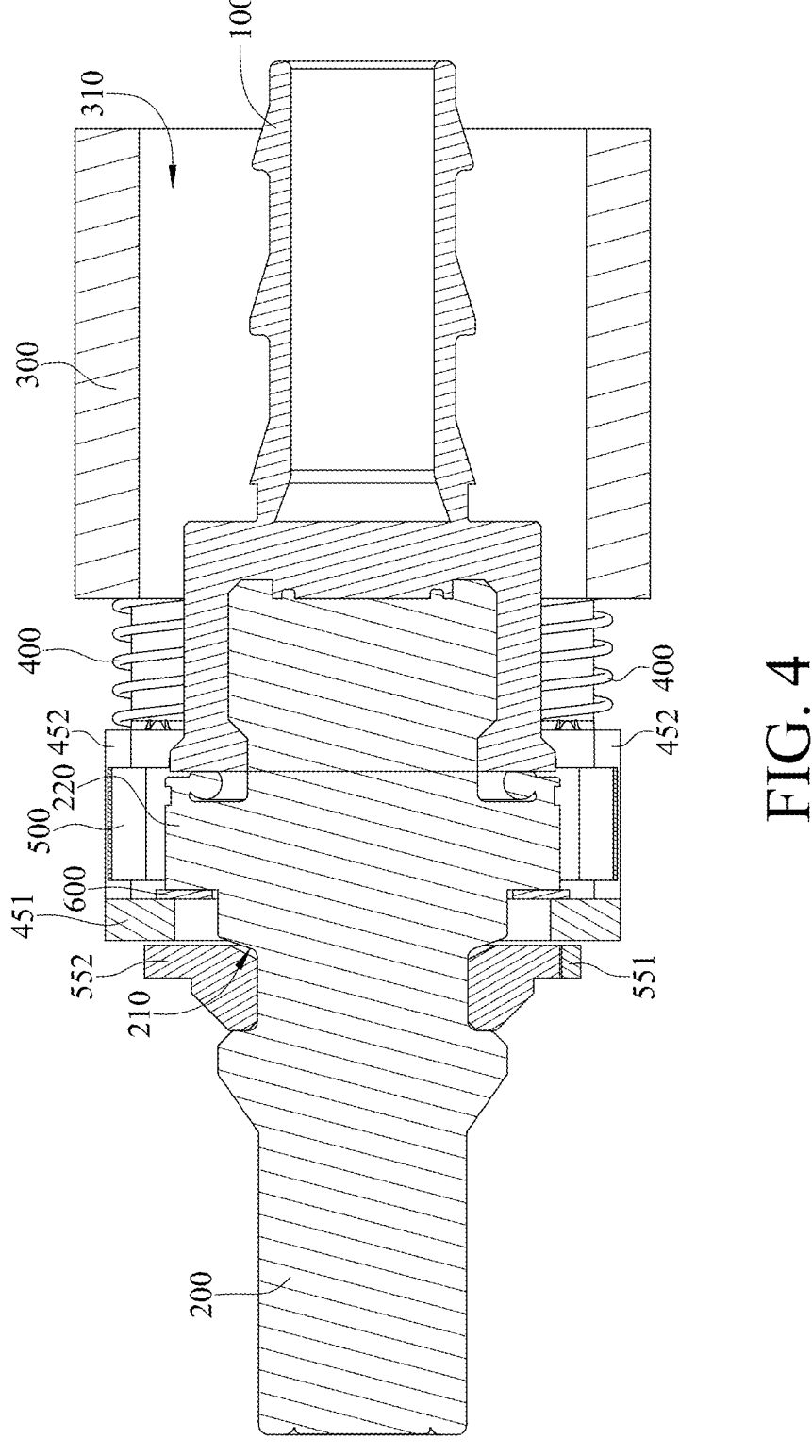
FIG. 4 is cross-sectional view of the coupling assembly along cutting line 4-4 in FIG. 1.

Please refer to FIG. 1 through FIG. 4. FIG. 1 is a perspective view of a coupling assembly according to one embodiment of the disclosure. FIG. 2 is an exploded view of the coupling assembly in FIG. 1. FIG. 3 is cross-sectional view of the coupling assembly along cutting line 3-3 in FIG. 1. FIG. 4 is cross-sectional view of the coupling assembly along cutting line 4-4 in FIG. 1.

In this embodiment, a coupling assembly 10 includes a first coupler 100, a second coupler 200, a first assembling base 300, a plurality of assembling pins 350, a plurality of elastic members 400, a second assembling base 450, a resilient ring 500, a snap ring 550 and a gasket 600. The first assembling base 300, the assembling pins 350, the elastic members 400, the second assembling base 450, the resilient ring 500, the snap ring 550 and the gasket 600 may together constitute a coupling auxiliary assembly.

The second coupler 200 is connected to the first coupler 100. Each of the first coupler 100 and the second coupler 200 is, for example, a universal quick disconnect (UQD).

The first assembling base 300 includes a first coupler through hole 310, a plurality of assembling holes 320 and a plurality of corners 330. The assembling holes 320 are radially separated from the first coupler through hole 310. Moreover, an extension direction E1 of the assembling holes 320, for example, is parallel to an extension direction E2 of the first coupler through hole 310. The assembling holes 320 are located at the corners 330, respectively. The first coupler 100 passes through the first coupler through hole 310 along an axial direction A. The first assembling base 300, for example, is fixed to a server rack or cabinet (not shown in the drawings).

Each of the assembling pins 350 includes a head part 351 and a body part 352 connected to each other. The diameter D1 of the head part 351 is greater than the diameter D2 of the body part 352. The body parts 352 of the assembling pins 350 are disposed in the assembling holes 320, respectively. The head part 351 abuts against a side of the first assembling base 300.

Each of the elastic members 400, for example, is a spring sleeved on the body part 352 of respective assembling pin 350.

The second assembling base 450 is movably disposed on the first assembling base 300 along the axial direction A through the assembling pins 350 and the elastic members 400. More specifically, the second assembling base 450, for example, includes a body 451 and a plurality of the assembling protrusions 452. The assembling protrusions 452 protrude from a side of the body 451 close to the first assembling base 300. The body 451 includes a second coupler through hole 453. The second coupler 200 passes through the second coupler through hole 453. Moreover, for each assembling pin 350, an end of the body part 352 away from the head part 351 is fixed to respective assembling protrusion 452. The head parts 351 abut against a side of the first assembling base 300 away from the second assembling base 450. For each elastic member 400, opposite ends of the elastic member 400 abut against the first assembling base 300 and respective assembling protrusion 452, respectively. The first assembling base 300, for example, further includes a recess 340, and an end of the elastic member 400 may abut against a bottom face 341 of the recess 340. With the assistance of the elastic member 400, the first coupler 100 can float axially in the first coupler through hole 310.

It is noted that the coupling assembly includes only one assembling pin in some other embodiments. In such one or more embodiments, the coupling assembly also includes only one assembling hole, only one elastic member and only one assembling protrusion.

The resilient ring 500 includes a plurality of convex portions 501 and a plurality of concave portions 502, and the convex portions 501 as well as the concave portions 502 are arranged alternately. The resilient ring 500 is sleeved on the second coupler 200 and located between the second coupler 200 and the assembling protrusion 452. The convex portions 501 of the resilient ring 500 abut against the inner side of respective assembling protrusions 452. With the assistance of the resilient ring 500, the second coupler 200 can float radially in the second coupler through hole 453.

The snap ring 550 is disposed in a groove 210 of the second coupler 200. The body 451 of the second assembling base 450 is located between the snap ring 550 and a flange 220 of the second coupler 200. In this embodiment, the snap ring 550, for example, includes a first portion 551 and a second portion 552. Each of the first portion 551 and the second portion 552 is in a shape of semi-circle, and the first portion 551 and the second portion 552 are fastened to each other. The first portion 551 and the second portion 552 are disposed in the groove 210 of the second coupler 200. In some other embodiments the snap ring may be one-piece formed and in a shape of circle.

The gasket 600 is sandwiched between the body 451 of the second assembling base 450 and the flange 220. With the assistance of the snap ring 550 and the gasket 600, the body 451 of the second assembling base 450 can be more firmly disposed on the second coupler 200 and confined in the axial direction.

According to the present disclosure, since the assembling hole is radially separated from the first coupler through hole, the assembling pin in the assembling hole does not occupy the first coupler through hole where the first coupler passes. Accordingly, it is favorable for ensuring the floating effect of the first coupler and the second coupler while achieving small volume of the first assembly base.

Furthermore, since the first coupler passes through the first coupler through hole and the second coupler passes through the second assembling base, the coupling auxiliary assembly (the first assembling base, the assembling pin, the elastic member and the second assembling base) can be mounted to the first coupler and the second coupler, such that the coupling auxiliary assembly does not need to be processed together with the first coupler and the second coupler, thereby facilitating the assembling and manufacturing of the coupling auxiliary assembly.

Also, with the assistance of the resilient ring, the second coupler can float radially in the second coupler through hole.

The coupling assembly and the coupling auxiliary assembly as described in the present disclosure can be applied to server hosts. The server hosts may be used for artificial intelligence (AI) computing, edge computing, and also be served as 5G servers, cloud servers, or Internet of Vehicles servers.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A coupling assembly, comprising:
a first coupler;
a second coupler, connected to the first coupler;
a first assembling base comprising a first coupler through hole and at least one assembling hole, wherein the at least one assembling hole is radially separated from the first coupler through hole, and the first coupler passes through the first coupler through hole along an axial direction;
at least one assembling pin, at least partially disposed in the least one assembling hole;
at least one elastic member, sleeved on the at least one assembling pin;
a resilient ring comprising at least one convex portion and at least one concave portion, wherein the at least one convex portion and the at least one concave portion are arranged alternately, and the resilient ring is sleeved on the second coupler; and a second assembling base comprising a body and at least one assembling protrusion, wherein the at least one assembling protrusion protrudes from a side of the body close to the first assembling base, the body is movably disposed on the first assembling base along the axial direction through the at least one assembling pin and the at least one elastic member, and the second coupler passes through the body;

wherein the resilient ring is between the second coupler and the at least one assembling protrusion, and the at least one convex portion of the resilient ring abuts against an inner side of the at least one assembling protrusion.

2. The coupling assembly according to claim 1, wherein a number of the at least one assembling hole, a number of the at least one assembling pin and a number of the at least one elastic member are plural, the assembling holes are respectively located at a plurality of corners of the first assembling base, the assembling pins are respectively at least partially disposed in the assembling holes, and the elastic members are respectively sleeved on the assembling pins.

3. The coupling assembly according to claim 1, wherein the at least one assembling pin comprises a head part and a body part connected to each other, a diameter of the head part is greater than a diameter of the body part, an end of the body part away from the head part is fixed to the second assembling base, the body part is disposed in the assembling hole, the head part abuts against a side of the first assembling base away from the second assembling base, and opposite ends of the at least one elastic member respectively abut against the first assembling base and the second assembling base.

4. The coupling assembly according to claim 3, wherein the body comprises a second coupler through hole, the second coupler passes through the second coupler through hole, an end of the body part away from the head part is fixed to the at least one assembling protrusion, the at least one elastic member is sleeved on the body part, and opposite ends of the at least one elastic member respectively abut against the first assembling base and the at least one assembling protrusion.

5. The coupling assembly according to claim 3, further comprising a snap ring, wherein the snap ring is disposed in a groove of the second coupler, the body of the second assembling base is between the snap ring and a flange of the second coupler.

6. The coupling assembly according to claim 5, further comprising a gasket sandwiched between the body of the second assembling base and the flange.

7. The coupling assembly according to claim 5, wherein the snap ring comprises a first portion and a second portion, the first portion and the second portion are fastened to each other and disposed in the groove of the second coupler.

8. A coupling auxiliary assembly, configured to assemble a first coupler with a second coupler, comprising:

a first assembling base comprising a first coupler through hole and at least one assembling hole, wherein the at least one assembling hole is radially separated from the first coupler through hole, and the first coupler through hole is configured for the first coupler to pass therethrough along an axial direction;

at least one assembling pin, at least partially disposed in the least one assembling hole;

at least one elastic member, sleeved on the at least one assembling pin;

a resilient ring comprising at least one convex portion and at least one concave portion, wherein the at least one convex portion and the at least one concave portion are arranged alternately, and the resilient ring is sleeved on the second coupler; and a second assembling base comprising a body and at least one assembling protrusion, wherein the at least one assembling protrusion protrudes from a side of the body close to the first assembling base, the body is movably disposed on the first assembling base along the axial direction through the at least one assembling pin and the at least one elastic member, and the body is configured for the second coupler to pass therethrough;

wherein the resilient ring is between the second coupler and the at least one assembling protrusion, and the at least one convex portion of the resilient ring abuts against an inner side of the at least one assembling protrusion.

9. The coupling auxiliary assembly according to claim 8, wherein a number of the at least one assembling hole, a number of the at least one assembling pin and a number of the at least one elastic member are plural, the assembling holes are respectively located at a plurality of corners of the first assembling base, the assembling pins are respectively at least partially disposed in the assembling holes, and the elastic members are respectively sleeved on the assembling pins.

\* \* \* \* \*